United States Patent [19]
Mooney

[11] Patent Number: 5,905,391
[45] Date of Patent: May 18, 1999

[54] MASTER-SLAVE DELAY LOCKED LOOP FOR ACCURATE DELAY OR NON-PERIODIC SIGNALS

[75] Inventor: Stephen Randall Mooney, Beaverton, Oreg.

[73] Assignee: Intel Corporation, Santa Clara, Calif.

[21] Appl. No.: 08/892,581

[22] Filed: Jul. 14, 1997

[51] Int. Cl.⁶ ........................................................ H04L 7/00
[52] U.S. Cl. .................... 327/161; 327/141; 395/552; 395/881
[58] Field of Search ............................. 375/356; 395/881, 395/551, 552; 327/141, 161, 154

[56] References Cited

U.S. PATENT DOCUMENTS

| | | | |
|---|---|---|---|
| 5,696,951 | 12/1997 | Miller | 327/161 |
| 5,748,018 | 5/1998 | Ishikawa | 327/161 |
| 5,794,020 | 8/1998 | Tanaka et al. | 395/552 |

OTHER PUBLICATIONS

Bazes, Mel and Roni Ashuri, "A Novel CMOS Digital Clock and Data Decoder", *IEEE Journal of Solid–State Circuits*, vol. 27, No. 12, Dec. 1992, pp. 1934–1940.

Lee, Thomas H. et al., "A 2.5 V CMOS Delay–Locked Loop for an 18 Mbit, 500 Megabyte/s DRAM", *IEEE Journal of Solid–State Circuits*, vol. 29, No. 12, Dec. 1994, pp. 1491–1496.

Reese, Edmund A. et al., A Phase–Tolerant 3.8 GB/s Data–Communication Router for a Multiprocessor Supercomputer Backplane, *IEEE International Solid–State Circuits Conference*, Digest of Technical Papers, Feb. 1994, ISSCC94, pp. 296–297; and 1994 ISSCC Slide Supplement pp. 232–233, and 326–328.

*Primary Examiner*—Tuan T. Lam
*Attorney, Agent, or Firm*—Alan K. Aldous

[57] ABSTRACT

The present invention involves an electrical component interface system. The system includes clocking circuitry to provide a clock signal. A sending component provide a non-periodic strobe signal and a data signal responsive to the clocking signal. A receiving component receives the strobe signal and data signal. The receiving component includes delay circuitry to delay the strobe signal so as to position edges of the strobe signal with respect to data cells of the data signal. The delay circuitry includes a loaded delay elements and DC level restoration circuitry to control the load of the loaded delay element. The delay elements may be a series of inverters loaded with RC loads. The DC level restoration circuitry may be pulse generation circuitry.

26 Claims, 6 Drawing Sheets

MASTER-SLAVE DELAY LOCKED LOOP FOR ACCURATE DELAY OR NON-PERIODIC SIGNALS

BACKGROUND OF THE INVENTION

1. Technical Field of the Invention

The present invention relates to an interface system that includes delay circuitry to delay a non-periodic strobe signal between electrical components and, more particularly, to such an interface system in which the delay circuitry includes DC level restoration to prevent pattern dependent jitter.

2. Background Art

Data is often transferred between two electrical components. For example, data is transferred between a microprocessor and memory. In what is referred to as a common clock paradigm, signals from a clock are supplied to both the sending and receiving component. Data is transferred from the sending component and latched in the receiving component within one clock cycle. Accordingly, the rate at which data can be transferred between components is limited by the flight time of the data across the conductors. Above a certain level of clock frequency, the common clock methods can no longer be used because the electrical length of the interconnect becomes longer than a clock period.

To overcome the problem, techniques have been developed in which timing information is transmitted with the data in order to latch it at the receiving side of a link. This is referred to as source synchronous signaling. Under one technique, timing information is transmitted on the same conductor as the data. Under a second technique, timing information is transmitted over a separate conductor.

Under one approach of the second technique, a differential timing signal or strobe toggles only when data is being transmitted on the link between components. The data is latched at the receiving side of the link. A circuit translates the latched data to the receiving component's clock domain. The strobe signal is offset from the data to center the strobe with respect to the data cell. A series of resistor capacitor loaded inverters have been used in delay circuits. Providing an accurate delay is complicated by the strobe signal being non-periodic. By non-periodic, it is meant that the strobe signal toggles only in connection with transfer of data. (However, the strobe signal may be periodic within temporal boundaries.) Accordingly, the timing information is available only intermittently. Also, nodes of delay circuitry have a bandwidth greater than the frequency of the incoming data. If this condition is not met, the voltage of the nodes in the delay circuitry may become data pattern dependent. For a clock pattern, the voltages of the nodes do not reach the rails, whereas for long strings of ones and zeros, the voltages do, leading to pattern dependent jitter of the timing signals.

Accordingly, there is a need for an interface system that avoids pattern dependent jitter in delaying non-periodic timing signals.

SUMMARY OF THE INVENTION

The present invention involves an electrical component interface system. The system includes clocking circuitry to provide a clock signal. A sending component provides a strobe signal and a data signal responsive to the clock signal. A receiving component receives the strobe signal and data signal. The receiving component includes delay circuitry to delay the strobe signal so as to position edges of the strobe signal with respect to data cells of the data signal. The delay circuitry includes a loaded delay element and DC level restoration circuitry to control the load of the loaded delay element. In some embodiments of the invention, the strobe signal is non-periodic.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION OF PREFERRED EMBODIMENTS

Figure 1:
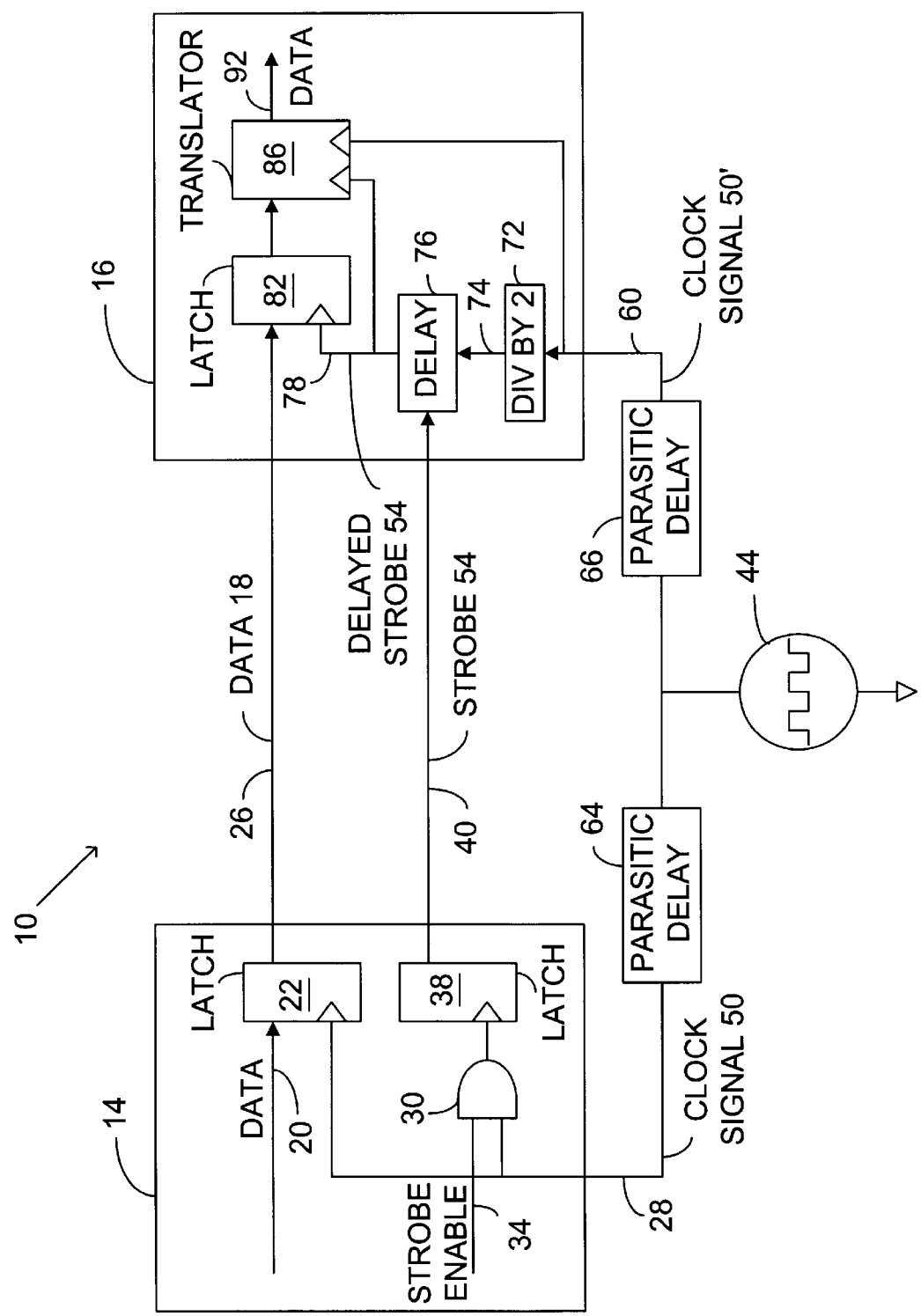
FIG. 1 is a schematic block diagram representation of an electrical component interface system according to one embodiment of the present invention.

Referring to FIG. 1, an electrical component interface system 10 includes two electrical components 14 and 16. Interface system 10 has particular application for high speed transfer of data from component 14 to component 16. Components 14 and 16 may be any of a variety of components including, but not limited to microprocessors, memories, logic, and controllers. Component 14 may be a microprocessor and component 16 may be a memory (e.g., L2 cache) separated by a high speed bus (e.g., a backside bus similar to the backside bus associated with the Pentium® Pro processor manufactured by Intel Corporation). Components 14 and 16 may be part of a personal computer, including a desk top, server, or portable computer. Only a portion of the structure of components 14 and 16 is illustrated.

In component 14, a data signal 18 is provided on conductors 26 from conductors 20 through a latch 22 in response to a clock signal 50 on a conductor 28. Latch 22 may comprise a D flip-flop. Clock signal 50 is also provided to one input of an AND gate 30. Another input of AND gate 30 is connected to a conductor 34 on which a strobe enable signal is selectively applied. The output of AND gate 30 is applied to the clock input of a latch 38. When the strobe enable signal is asserted, latch 38 provides a strobe signal 54 on conductor 40 in response clock signal 50. Latch 38 may comprise a toggle flip-flop. Under an alternative embodiment, the D input of the flip-flop is controlled.

The strobe enable signal on conductor 34 is asserted in connection with the transfer of data from electrical component 14 to electrical component 16 and is otherwise not asserted. For example, a transfer of four sections of data signal 18 may be completed in four clock cycles of clock signal 50. With the transfer of the last data section, the strobe enable signal is deasserted and strobe signal 54 is no longer active. In this sense strobe signal 54 is non-periodic (although it may be periodic for a limited time).

Clock signal 50 originates from a clock source 44. A clock signal 50' from clock source 44 is provided to a conductor 60. There may be parasitic delays on conductors 28 and 60 (represented as parasitic delays 64 and 66) that delay clock signals 50 and 50'. Clock signals 50 and 50' are distributed in an imperfect manner so that there is not an exact replica of the original clock. Ideally, clock signals 50 and 50' are identical. Clock signals 50 and 50' may be thought of as a single clock signal.

Figure 2:
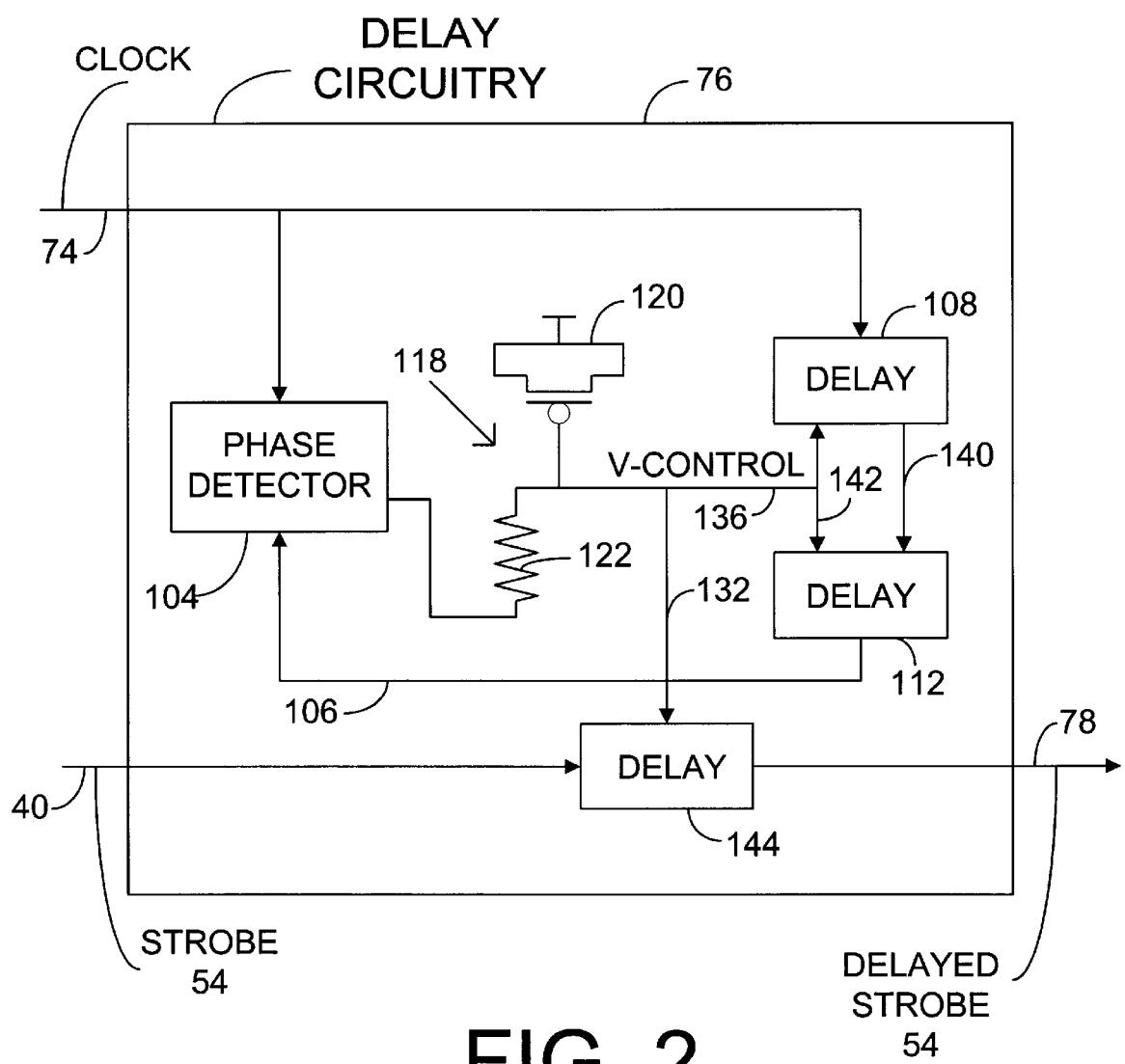
FIG. 2 is a schematic block diagram representation of delay circuitry employed in the system of FIG. 1.

A latch 82 receives data signal 18 from conductors 26. If there were no delay circuitry 76, if strobe signal 54 and data signal 18 arrived coincident, there would be no setup time for bits of data in latch 82. Referring to FIGS. 1 and 2, to solve this problem, strobe signal 54 is delayed by a delay circuitry 76 in receiving component 16 so that, ideally, a triggering edge of strobe signal 54 is centered between the beginning and end of a data cell. By doing so, there is an equal amount of time for set up and hold time or margin. Alternatively, strobe signal 54 may be delayed by a different amount, leading to a difference in the set up and hold time. Triggering edges may be only the rising edges, only the falling edges, or both the rising and falling edges.

Referring to FIG. 1, a translator 86 translates data signal 18 from latch 82 to the clock domain of receiving component 16. There are two clock or timing domains in interface system 10. A first timing domain is that of clock 44. A second clock domain is that of strobe signal 54. The timing domain of strobe signal 54 is different from that of clock signal 50' because of various delays, including that of the flight time of strobe signal 54 across conductor 40. Accordingly, the phase of strobe signal 54 is independent of that of clock signals 50 and 50'. Clock signals 50 and 50' are close enough to treat them as being part of one clock domain. Translator 86 synchronizes data signal 18 with clock signal 50'. Translator 86 provides enough latency to handle any phase offset between strobe signal 54 and clock signal 50'.

The delay introduced by delay circuitry 76 preferably accomplishes two criteria. First, the delay should be accurate so that a triggering edge of delayed strobe signal 54 is centered in the data cell. Second, the delay should be insensitive to variations in supply voltage. Further, it is preferred that delay circuitry 76 provide the desired delay even though strobe signal 54 does not toggle at all times, but rather only while data is being transferred.

As noted, components 14 and 16 receive clock signals 50 and 50' from clocking source 44. As such, strobe signal 54 has the same or a related frequency to that of clock signal 50', with only a phase offset. Delay circuitry 76 uses frequency information from clock signal 50' to generate the delay.

The frequency of clock signal 50' is divided by two by divide-by-two circuit 72 such that the period of the clock signal on conductor 74 is twice that of clock signal 50'. The larger period makes providing the proper delay in delay 76 easier. The resulting clock signal is provided by conductor 74 to delay circuitry 76.

Referring to FIG. 2, master-slave delay circuitry 76 receives strobe signal 54 on conductor 40 and the clock signal from conductor 74. Delay circuitry 76 includes a delay lock loop including voltage controlled delay circuitry 108 and delay circuitry 112, and a phase detector 104 that compares the phase of the clock signal on conductor 74 with a delayed feedback signal on a conductor 106. The output of phase detector 104 is provided to an RC filter 118 including a resistor 122 and a p-channel metal oxide semiconductor (pMOS) transistor 120 acting as a capacitor. To keep delay circuitry 76 simple, filter 118 is a simple one pole RC circuit acting as a low pass filter to filter noise. Because delay circuitry 108, 112, and 144 are delay circuitry within delay circuitry, delay circuitry 108, 112, and 144 may be referred to as sub-delay circuits.

A voltage control (V-Control) signal on conductor 136 is provided to delay circuitry 108 and 112 through a conductor 142, and to voltage controlled delay circuitry 144 through a conductor 132. Delay circuitry 108, 112, and 144 are identical to each other. The V-Control signal modulates delay circuitry 108 and 112 until the delay of delay circuitry 108 and 112 is equal to one phase of the clock signal on conductor 74. When the delay through delay circuitry 108 and 112 is equal to one phase of the clock signal, a loop is then locked and will stay in lock. The delay in the loop that includes delay circuitry 108 and 112 provides a delay from the beginning to the end of a data cell. The delay of delay circuitry 144 provides one-half that delay, which centers an active or triggering edge (rising or falling) of delayed strobe signal 54 half way between the beginning and end of the data cell.

Figure 3:
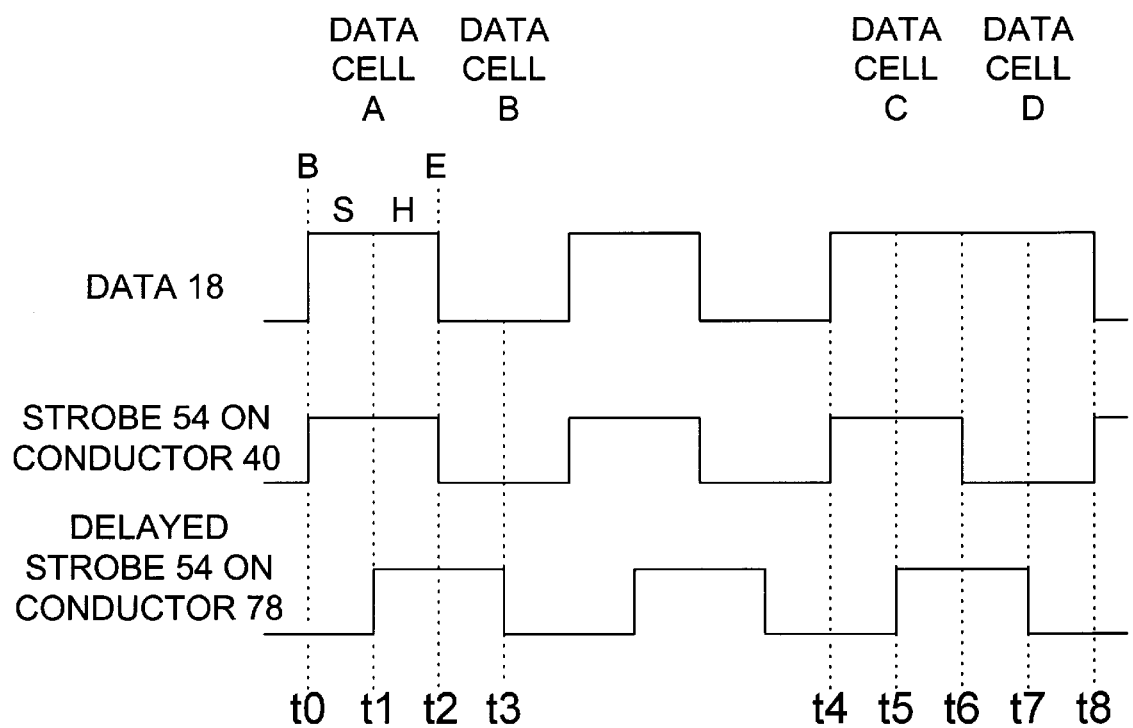
FIG. 3 is a graphical representation of a data signal, a strobe signal, and a delayed strobe signal produced in the system of FIG. 1.

FIG. 3 provides a timing diagram showing general relationships between data signal 18, strobe 54 on conductor 40, and delayed strobe 54 on conductor 78. Data signal 18 includes various data cells of which data cells A, B, C, and D are specifically identified. The data cells have a beginning edge (B) and an ending edge (E). (Of course, the actual signals do not have such sharp edges.) The data or bit period (also called cell width) is between two adjacent edges (e.g. from time t0 to time t2). Data cell A is a logical 1 value and data cell B is a logical 0 value. Both data cells C and D are logical 1 values. Data signal 18 follows a non-return to zero (NRZ) scheme. Accordingly, there is no transition between data cell C and data cell D. Data signal 18 is not periodic in the sense that the logic 0s and 1s do not follow any particular order. However, successive data cells generally have the same data width. Therefore, the data cell is said to have a period.

Strobe signal 54 is delayed so that the rising and falling edges of delayed strobe signal 54 are centered between the beginning and ending edges of data cells. For example, data cell A begins at time t0 and ends at time t2. Time t1 is half way between time t0 and time t2. A rising edge of delayed strobe 54 occurs at time t1. This allows an equal time for setup (S) and hold (H) of data in latch 82 or elsewhere in component 16. A falling edge of delayed strobe 54 occurs at time t3, which is half way between the beginning and end of data cell B and therefore provides equal time for setup and hold of data in latch 82 or elsewhere. The beginning and end of data cell C are at times t4 and t6. The beginning and end of data cell D are at times t6 and t8. A rising edge of delayed strobe signal 54 at time t5 is centered in data cell C, and a falling edge of delayed strobe signal 54 at time t7 is centered in data cell D. Accordingly, there is equal setup and hold time for data cells C and D.

In FIG. 3, the period of strobe signal 54 is twice that of a cell width (or period) of a data cell of data signal 18. (A period of strobe signal 54 is from time t4 to time t8.) As mentioned, strobe signal 54 is periodic within temporal limits when data is transferred but not otherwise. In other embodiments of the invention, the bit width may be the same as the period of strobe signal 54. In such a case, only one triggering edge, for example, the rising or leading edge of the strobe signal is centered. The case of FIG. 3 may have particular application for higher speed servers, whereas the case in which the cell width is the same as the strobe signal period may have particular application for slower, less expensive desk top computer systems. A two-to-one multiplexer in the delay loop may be used to have both data signal frequency capabilities in a single device. However, the delay of the multiplexor tends to be uncontrolled and increase the Vcc sensitivity.

Figure 4:
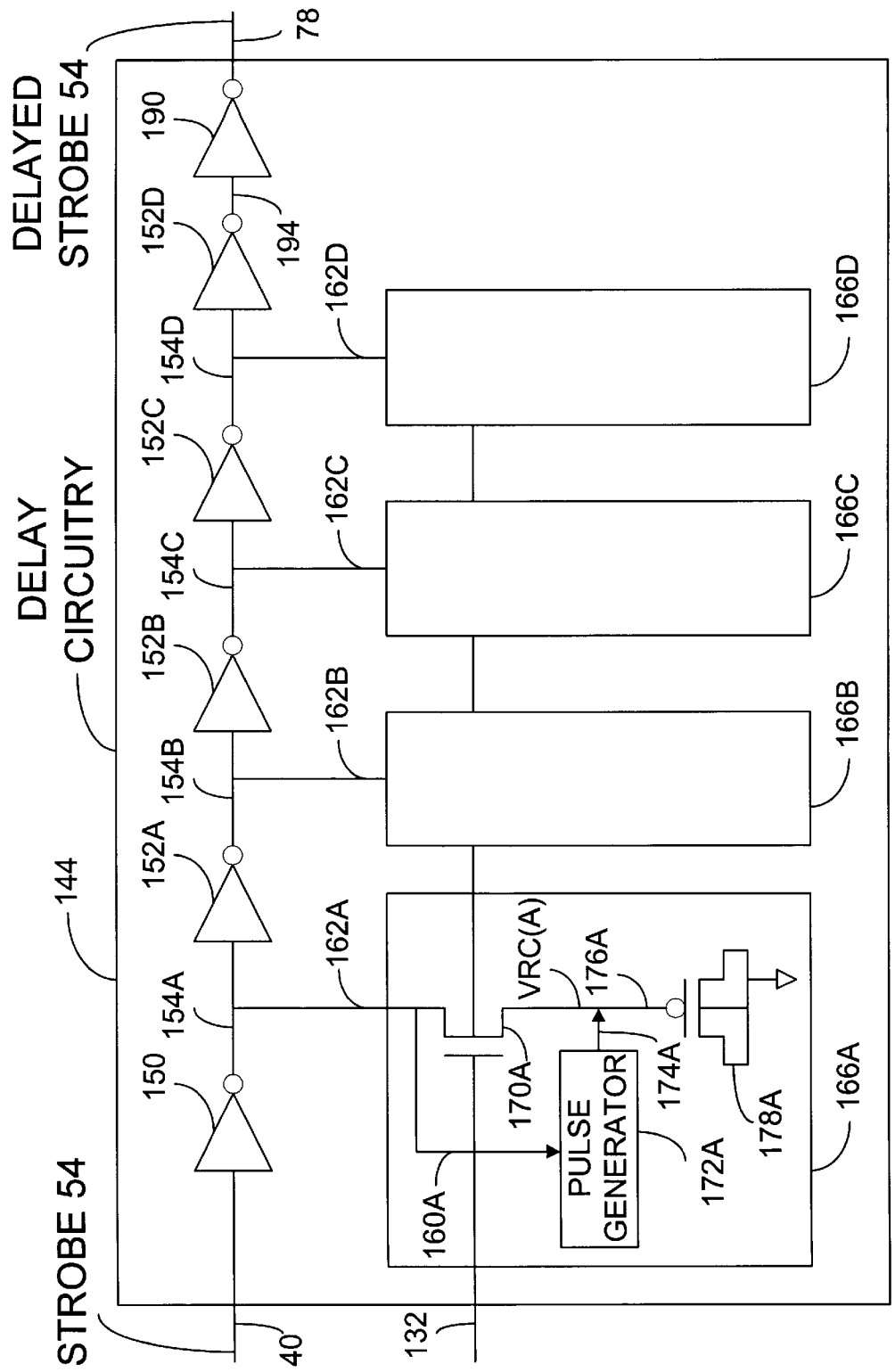
FIG. 4 is a schematic block diagram representation of delay circuitry employed in the delay circuitry of FIG. 2.

Referring to FIG. 4, strobe signal 54 on conductor 40 is inverted by an inverter 150 in delay circuitry 144. An inverter 152A (which is an example of a delay element) receives and inverts the inverted signal on conductor 154A from inverter 150. A controlled resistor-capacitor (RC) circuit 166A provides an RC load to inverters 150 and 152A through conductor 162A. The speed at which inverters 150 and 152A switch is related to the amount of the RC load. Controlled RC circuit 166A includes a pMOS transistor 178A which provides capacitance, and n-channel metal oxide semiconductor (nMOS) transistor 170A which provides resistance. The amount of resistance is controlled by the V-control signal on conductor 132. As described in greater detail below, a pulse generator 172A provides a DC level restoration to a voltage VRC(A) on conductor 176A.

An inverter 152B receives and inverts the signal on conductor 154B from inverter 152A. An inverter 152C receives and inverts the signal on a conductor 154C from inverter 152B. An inverter 152D receives the signal on a conductor 154D from inverter 152C. An inverter 190 inverts the signal on conductor 194 from inverter 152D. A controlled RC circuit 166B provides an RC load to inverters 150A and 152B through conductor 162B. A controlled RC circuit 166C provides an RC load to inverters 152B and 152C through conductor 162C. A controlled RC circuit 166D provides an RC load to inverters 152C and 152D through conductor 162D. Controlled RC circuits 166B, 166C, and 166D are essentially identical to circuit 166A.

The number of inverters sets the range of possible delays (i.e., upper and lower limits) for strobe signal 54 through delay circuitry 144. Of course, there may be a greater or lesser number than are illustrated in FIG. 4. The V-control signal on conductor 132 sets the particular actual delay within the range.

In FIG. 4, voltage VRC(A) is the voltage at the node of conductors 174A and 176A. Pulse generator 172A in controlled RC circuit 166A is a DC level restoration circuit that provides a DC level restoration signal to the node of conductors 174A and 176A. The DC level restoration signal effects the voltage VRC(A) and, therefore, the speed at which inverter 152A switches. There is a voltage VRC(B) at a conductor 176B (not shown) in controlled RC circuit 166B that corresponds to conductor 176A in controlled RC circuit 166A. Likewise, a pulse generator 172B (not shown) in controlled RC circuit 166B is a DC level restoration circuit that provides a DC level restoration signal to the node of conductors 174B and 176B (not shown). The DC level restoration signal effects the voltage VRC(B) and, therefore, the speed at which inverter 152B switches. Sizing the load correctly with respect to the inverter makes the circuit quite insensitive to variations in Vcc, since changes in the load track changes in the inverter. A problem with using delay circuitry 76 in a high speed application (e.g., a back-side-bus application) is that the node of conductors 174A and 176A, particularly at low control voltages, has very low bandwidth. As discussed earlier, this may add pattern dependent jitter to the input stage when the capacitor voltage is pattern dependent. The DC level restoration solves the problem.

Figure 5:
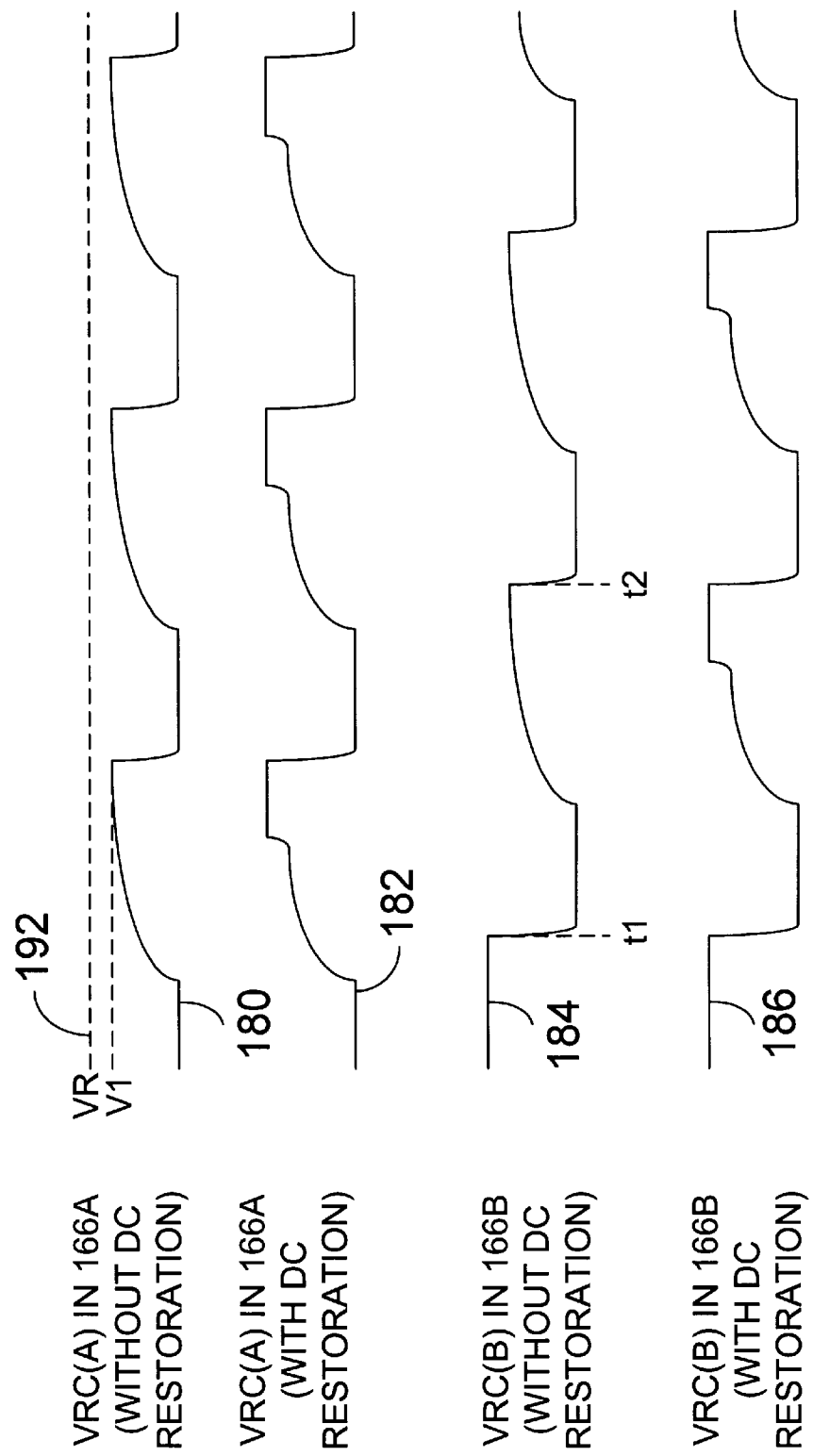
FIG. 5 is a graphical representation of voltage signals in the delay circuitry of FIG. 4 without and with DC level restoration.

A purpose of pulse generators 172A, 172B, etc. is to avoid pattern dependent jitter. Pattern dependent jitter describes the situation in which the voltage levels of cycles of a signal depends on the signal's initial state and/or the length of signal. Without pulse generators 172A, 172B, etc. the values of VRC(A), VRC(B), etc., could depend on the length of time strobe signal 54 toggles, and/or whether strobe signal 54 is transistioning high or low at the beginning of a transaction. Referring to FIG. 5, the effect of pulse generator 172A on VRC(A) and the effect of pulse generator 172B (not shown) on VRC(B) is illustrated by signals 180, 182, 184, and 186. Signal 180 represents what voltage VRC(A) could be without pulse generator 172A. A reference 192 (shown in dashed lines) represents a rail voltage. Signal 182 represents voltage VRC(A) with pulse generator 172A operating. Signal 184 represents what voltage VRC(B) would be without pulse generator 172B (not shown). Signal 186 represents voltage VRC(B) with pulse generator 172B operating. In FIG. 5, it is assumed that the signals are in response to the rising edge of strobe signal 54 on conductor 40.

For example, for a high going edge of strobe signal 54 followed by a low going edge one bit cell later, the highest voltage of signal 180 may be Vl. By contrast, if strobe signal 54 stays high for a long time, the highest voltage of signal 180 could be close to the rail voltage VR. Accordingly, the rise time of the inverters and, therefore, the delay through delay circuitry 144 would be different depending on the length of time the signal remains high, which is undesirable. However, with pulse generator 172A operating, the highest voltage of signal 182 is approximately VR regardless of the length of time strobe signal 54 stays high. Signal 182 has a rise and fall time independent of the duration of strobe signal 54. With DC level restoration, at the end of every cycle through the delay circuitry, the voltage VRC(A), VRC(B), etc. is restored to the quiescent value which will be the same for every cycle.

In the case of signal 184, at the beginning of a transaction, the strobe signal on conductor 154A is at approximately the rail voltage. However, thereafter, the highest voltage is somewhat less than the rail voltage. As an example, the trip point of inverter 152B is at ½ Vcc. The falling edge at time t1 starts from a quiet level, whereas the falling edge at time t2 starts from a lower voltage level. Inverter 152B will switch faster with the falling edge of time t2 than for the falling edge of time t1. This is an example of pattern dependent jitter. In signal 186, the DC level is present with each cycle so that there is the same delay regardless of signal pattern.

Figure 6:
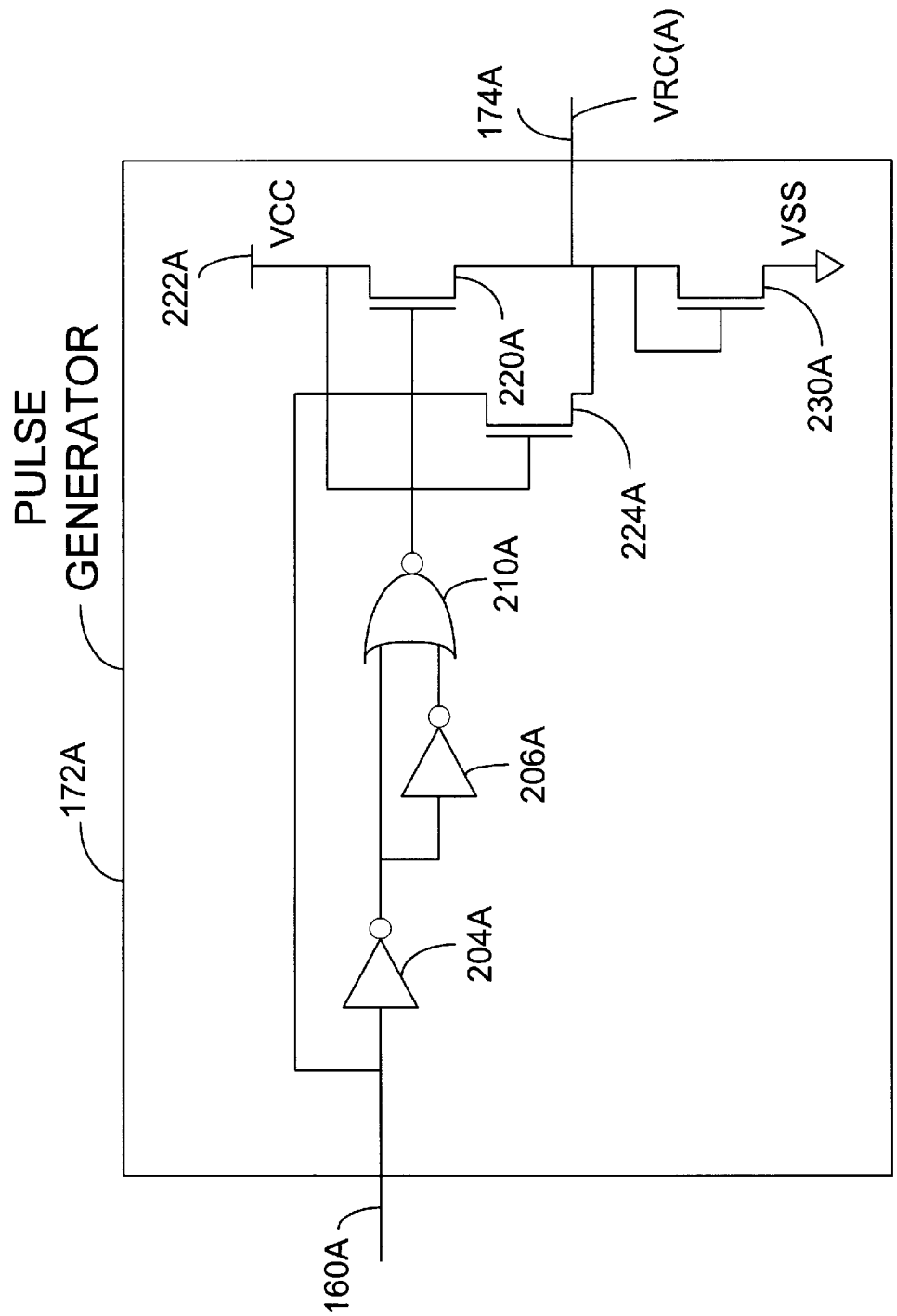
FIG. 6 is a pulse generator employed in the delay circuitry of FIG. 6.

Details of one embodiment of pulse generator 172A are provided in connection with FIG. 6. Generally, low going edges of VRC(A) are not a problem. The problem tends to be with high going edges. The voltage signal on conductor 160A is provided to inverter 204A and the drain of an nMOS transistor 224A. The inverted signal at the output of inverter 204A is provided to the input of an inverter 206A and an input of NOR gate 210A. The output of inverter 206A is also provided to an input of NOR gate 210A. Because of a delay through inverter 206A, NOR gate 210A provides a brief pulse at its output, which is provided to the gate of nMOS transistor 220A. A reference voltage 222A is provided to the gate of transistor 224A so that it is always ON. The gate of an nMOS transistor 230A is tied to its drain at the node of conductor 174A. In operation, pulse generator 172A pulses transistor 220A high, restoring the voltage level of Vcc−Vt (threshold voltage) once the input to inverter 204A passes ½ Vcc. Transistor 224A acts as a small keeper circuit to hold the voltage at this level. Transistor 230A is a long channel device that provides a small (e.g., <1 micro amp (ua)) bias current for transistor 224A so that subthreshold leakage does not pull VRC(A) above the restoration level. This gives a pattern independent delay that is relatively insensitive to the level of Vcc. Note that the loop filter is coupled to Vcc rather than Vss. Accordingly, a change in Vcc appears across inverter 150A also appears to transistor 170A, enhancing the Vcc noise rejection of delay circuitry 144. The transistors are sized so as to minimize Vcc sensitivity.

Additional Information and Embodiments

Many variations in the various circuitry of the illustrations will be apparent to those skilled in the art having the benefit of this disclosure. For example, the various logic circuits illustrated herein may be replaced with other logic circuits that perform the same functions. The general functions of the invention may be performed by significantly different circuitry. For example, a master-slave delay locked loop is not required.

Where a single conductor is illustrated or described, it may be replaced by parallel conductors. Where parallel conductors are illustrated or described, they may be replaced by a single conductor.

It is not required that delay circuits 108, 112, and 144 be identical to each other. Further, it is not required that controlled RC circuitry 166A, 166B, 166C, and 166D be identical to each other.

Although delay circuitry 144 in FIG. 4 includes an six inverters. A greater or lesser number of inverters may be used. Further, an even or an odd number of inverters may be used. Inverter 190 may serve two purposes. First, inverter 190 cleans up the edges of strobe signal 54. Second, it provides an even number of inversions so that the rising edge of delay strobe signal 54 is properly phased. Neither of these two purposes is required. First, the edges of strobe signal 54 may be sufficient without inverter 190. Second, depending on the number of inverters in delay circuitry 144, there may be an even number of inverters without inverter 190. Also, the circuitry and timing may be such that an odd number of inverters provides the desired result.

Divide-by-two circuit 72 is not required, but is provided to create a greater clock period for delay circuitry 76.

Phase detector 104 may provide a bang-bang phase detection system from which the same amount of positive or negative phase correction is applied to control line 136, irregardless of how far the clock signal on conductor 74 is offset from the feedback signal on conductor 106. Phase detector 104 may be implemented as a simple latch. Phase detector 104 may be a replica of latch 82. By being a replica of latch 82, phase detector 104 has the same setup and hold characteristics at latch 82 so that the strobe signal on conductor 78 is shifted by the setup time of latch 82. If there is a non-zero setup time on latch 82, it would be preferred to shift the timing from the center of the data cell by that setup time. Filter 118 is used to reduce control voltage variations when the loop is in lock. Ideally, it would be preferred for the loop filter pole to be at as low a frequency as possible. The area available would typically be limited. The lock time requirements typically also would be limited. In some embodiments, the allowable ripple may be set to <30 mv, and the main filter set accordingly. A second, higher frequency filter may be used after reset deassertion in order to allow the loop to lock more quickly. The pole of this filter is set to minimize the lock time of the loop. Since the ripple increases with the filter pole, the minimum lock time should be calculated considering the poles of both filters, i.e., as the first pole is moved up, the lock time of the first filter decreases, but the lock time of the second loop increases.

As illustrated in FIG. 1, component 14 sends data to component 16. Of course, component 16 could also send data to component 14. Delay circuitry similar to that in component 16 may be included in component 14.

The above-described preferred embodiments are described in connection with a system in which timing information and data are transmitted on different conductors. However, the present invention may be used in connection with an interface system in which timing information is transmitted on the same conductor as the data.

The various structures of the present invention may be implemented according to any of various materials and methods known to those skilled in the art. There may be intermediate structure (such as a buffer) or signals that are between two illustrated structures. Some conductors may not be continuous as illustrated, but rather be broken up by intermediate structure. The borders of the boxes in the figures are for illustrative purposes. An actual device would not have to include such defined boundaries. The relative size of the illustrated components is not to suggest actual relative sizes.

The term "connected" and related terms are used in an operational sense and are not necessarily limited to a direct connection. For example, delay circuitry 144 is connected (although indirectly) to phase detector 104 through RC circuit 118 and conductor 132. The term "responsive" and related terms mean that one signal or event is influenced to some extent by another signal or event, but not necessarily completely or directly.

If the specification states a component "may", "could", or is "preferred" to be included, that particular component is not required to be included.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. An electrical component interface system, comprising:
   clocking circuitry to provide a clock signal;
   a sending component to provide a strobe signal and a data signal responsive to the clock signal; and
   a receiving component to receive the strobe signal and data signal, the receiving component including delay circuitry to delay the strobe signal so as to position edges of the delayed strobe signal with respect to data cells of the data signal, the delay circuitry comprising a slave sub-delay circuit having a loaded delay element and DC level restoration circuitry to control a load of the loaded delay element and wherein the delay of the strobe signal caused by the delay circuitry is responsive to the load and wherein the receiving component includes a circuit to receive the data signal and the delayed strobe signal.

2. The system of claim 1, wherein the edges of the delayed strobe signal are positioned in centers of the data cells so as to provide an equal amount of setup and hold time for the data cells.

3. The system of claim 1, wherein the delay circuitry includes a master slave delay locked loop including two master sub-delay circuits and the slave sub-delay circuit each introducing the same delays.

4. The system of claim 1, wherein the delay circuitry receives a derivative of the clock signal and the delay circuitry includes a delay locked loop that includes a voltage control signal that modulates the sub-delay circuit until the delay of the slave sub-delay circuit is equal to one phase of the derivative of the clock signal.

5. The system of claim 1, wherein frequency of the clock signal is divided by two and received by the delay circuitry.

6. The system of claim 1, wherein the DC level restoration circuitry comprises a pulse generator.

7. The system of claim 1, wherein the DC level restoration circuitry comprises a pulse generator providing a DC level restoration signal that is responsive to a supply voltage of the system.

8. The system of claim 1, wherein the delay circuitry includes a phase detector and a simple RC low pass filter to filter an output of the phase detector to produce a voltage control signal to control the slave sub-delay circuit.

9. The system of claim 1, wherein the placement of the edges of the strobe signal in centers of the data cells is insensitive to supply voltage variations.

10. The system of claim 1, wherein the strobe signal is a non-periodic strobe signal that is toggled only in response to transmission of the data signal.

11. The system of claim 1, wherein the loaded delay element includes an inverter.

12. The system of claim 1, wherein the load is provided by an RC circuit.

13. The system of claim 1, wherein the edges include only rising edges.

14. The system of claim 1, wherein the circuit to receive the data signal and the delayed strobe signal includes a latch.

15. The system of claim 1, wherein the delay circuitry includes additional loaded delay elements and the DC level restoration circuitry controls loads of the additional loaded delay elements.

16. An electrical component interface system, comprising:

a sending component to provide a non-periodic strobe signal and a data signal; and a receiving component to receive the strobe signal and data signal, the receiving component including delay circuitry to delay the strobe signal so as to position edges of the delayed strobe signal with respect to data cells of the data signal, the delay circuitry having a loaded delay element and DC level restoration circuitry to at least partially control a load of the loaded delay element and wherein the delay of the strobe signal caused by the delay circuitry is responsive to the load and wherein the receiving component includes a circuit to receive the data signal and the delayed strobe signal.

17. The system of claim 16, wherein the edges of the delayed strobe signal are positioned in centers of the data cells so as to provide an equal amount of setup and hold time for the data cells.

18. The system of claim 16, wherein the DC level restoration circuitry comprises a pulse generator.

19. The system of claim 16, wherein the DC level restoration circuitry comprises a pulse generator providing a DC level restoration signal that is responsive to a supply voltage of the system.

20. The system of claim 16, wherein the circuit to receive the data signal and the delayed strobe signal includes a latch.

21. The system of claim 16, wherein the delay circuits includes additional loaded delay elements and the DC level restoration circuitry at least partially controls loads of the additional loaded delay elements.

22. An electrical component interface system, comprising:

clocking circuitry to provide a clock signal;

a sending component to provide a non-periodic strobe signal and a data signal responsive to the clock signal; and a receiving component to receive the strobe signal and data signal, the receiving component including delay circuitry to delay the strobe signal so as to position edges of the delayed strobe signal with respect to data cells of the data signal, the delay circuitry having delay elements loaded with controlled RC circuits, the controlled RC circuits including DC level restoration circuitry to at least partially control a load of the loaded delay elements and wherein receiving component includes a latch circuit to receive the data signal and delayed strobe signal.

23. The system of claim 22, wherein the edges of the delayed strobe signal are positioned in centers of the data cells so as to provide an equal amount of setup and hold time for the data cells.

24. The system of claim 22, wherein delay circuitry is responsive to a derivative of the clock signal.

25. The system of claim 22, wherein the DC level restoration circuitry comprises a pulse generator.

26. The system of claim 22, wherein the DC level restoration circuitry comprises a pulse generator providing a DC level restoration signal that is responsive to a supply voltage of the system.

* * * * *

UNITED STATES PATENT AND TRADEMARK OFFICE
CERTIFICATE OF CORRECTION

PATENT NO. : 5,905,391
DATED : May 19, 1999
INVENTOR(S) : Mooney

It is certified that error appears in the above-identified patent and that said Letters Patent is hereby corrected as shown below:

<u>Title page, Item [54] and Column 1, line 2,</u>
Delete "OR" and insert -- OF --

Signed and Sealed this

Twenty-ninth Day of April, 2003

JAMES E. ROGAN
*Director of the United States Patent and Trademark Office*